United States Patent [19]

Lang et al.

[11] Patent Number: 4,536,723

[45] Date of Patent: Aug. 20, 1985

[54] HIGH-POWER PULSE GENERATOR USING TRANSMISSION LINE WITH SPARK DISCHARGE DEVICE

[75] Inventors: Stephen C. Lang, Merrimack; Paul E. Gili, Brookline, both of N.H.

[73] Assignee: Sanders Associates, Inc., Nashua, N.H.

[21] Appl. No.: 555,095

[22] Filed: Nov. 25, 1983

[51] Int. Cl.³ .............................................. H03K 3/02
[52] U.S. Cl. .................................. 331/127; 307/106; 331/129
[58] Field of Search ............... 331/126, 127, 128, 129, 331/131; 328/59, 65, 66, 67; 307/246, 106, 108; 315/39; 333/13

[56] References Cited

U.S. PATENT DOCUMENTS 2,769,101 10/1956 Drosd .................................. 307/108
3,286,196 11/1966 Landecker ...................... 331/128 X
4,484,085 11/1984 Fallier, Jr. et al. ................. 307/106

Primary Examiner—Siegfried H. Grimm
Attorney, Agent, or Firm—Louis Etlinger; Wm. F. Porter, Jr.

[57] ABSTRACT

A high-frequency, high-power generator of the type in which energy is stored in the capacitance of a transmission line and then discharged into a load by the action of a spark discharge device. The load is connected between one end of a transmission line conductor and ground and the other end of the same conductor is grounded. The line is folded and both ends of the other transmission line conductor are connected to the spark discharge device. A charging circuit applies a voltage to the latter conductor and when it reaches the discharge potential of the spark discharge device, the latter discharges to connect both ends of that conductor to ground. This provides relatively well-defined positive and negative pulses to the load.

4 Claims, 2 Drawing Figures

HIGH-POWER PULSE GENERATOR USING TRANSMISSION LINE WITH SPARK DISCHARGE DEVICE

BACKGROUND OF THE INVENTION

This invention relates to a high-power pulse generator of the type using a spark discharge device to initiate each pulse. More specifically it relates to a pulse generator which employs a transmission line both to provide capacitance for energy storage and to appropriately shape the output pulses.

The invention is particularly useful in the generation of high-power RF signals in remote locations. For example, it is often desirable to deploy an RF generator from an aircraft. Since the generator is expendable in such cases, it should have a relatively low cost, and since a number of them may be carried in the aircraft, they should be light in weight. They should also be reliable, and since they are to operate from expendable, light-weight power sources, they should be efficient.

Spark discharges have long been used to generate RF signals. In fact, so called "spark-gap" transmitters antedate vacuum tube RF sources by many years and, indeed, their use continued until long after the vacuum tube transmitters became available, largely because the spark-gap devices were both inexpensive and highly reliable.

The principal object of the invention is to provide a spark discharge pulse generator meeting the above criteria and capable of multi-megawatt peak power in the VHF and UHF portions of the electromagnetic spectrum.

SUMMARY OF THE INVENTION

The pulse generator described herein is connected as a relaxation oscillator. That is, a capacitor is charged through a resistor and a spark discharge device connected across the capacitor discharges the capacitor when the voltage reaches the ignition point of the discharge device. Then the cycle repeats. Unlike conventional relaxation oscillators, however, the capacitor is physically embodied in a transmission line that is connected in such a way that the discharge device not only discharges the capacitance, but also causes waves to propagate along the transmission line to provide appropriate shaping of the output pulses.

More specifically, assuming, for example, a coaxial transmission line, a length of line corresponding to the desired pulse width is looped so that both ends of the inner conductor are connected together to one terminal of the spark discharge device. The other terminal of the discharge device is connected to a common junction, e.g. ground. One end of the outer conductor of the transmission line is connected to ground; the other end of the outer conductor serves as an output terminal and thus is connected to the load. The capacitance between the inner and outer conductors of the transmission line charges until the voltage reaches the ignition of the spark discharge device. The discharge of this capacitance causes an immediate rise in voltage at the output terminal of the capacitance. If this were a conventional capacitor, the voltage would then gradually decay as the energy in the capacitor discharged through the output load.

With present invention, however, the pulse continues with a relatively flat top and then sharply drops. The reason for this is two-fold. In the first place, the capacitor is elongated and time is required for energy from portions more and more remote from the output end to reach the output terminal. This has the effect of discharging a succession of capacitors, thereby maintaining the output voltage relatively constant. It corresponds with the propagation of voltage wavefronts along the transmission line, these wavefronts providing constant output voltages which are sharply terminated when the wavefronts reach the output end of the line. The pulse widths thus correspond to the length of time for an electromagnetic signal to propagate from one end of the transmission line to the other.

DESCRIPTION OF THE PREFERRED EMBODIMENTS

Figure 1:
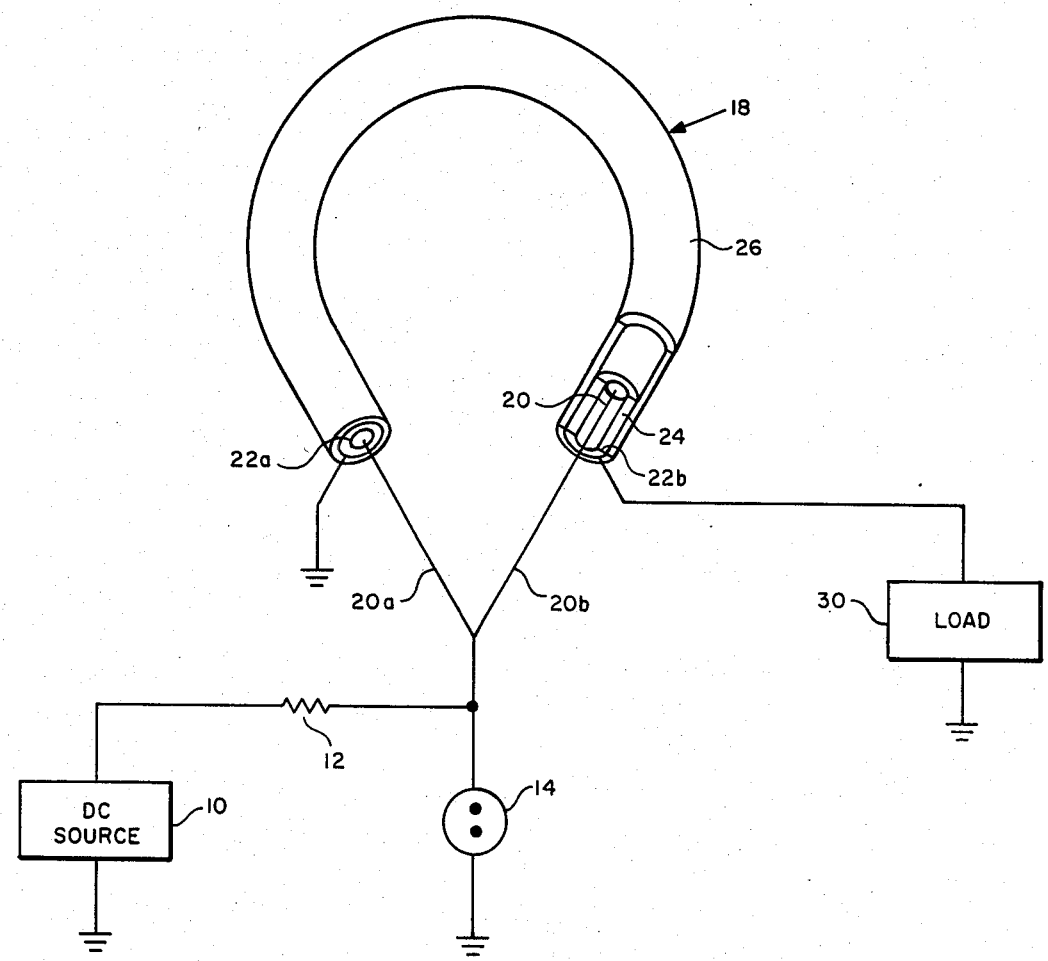
FIG. 1 is a diagram, partly schematic and partly pictorial, of a pulse generator embodying the invention.

As seen in the drawing, the generator includes a high-voltage DC source 10, connected through a series resistor 12 to the parallel combination of a spark discharge device 14 and an energy storage line 18. The line 18 is a transmission line, shown here as a coaxial line, although other forms are also suitable. Thus it has an inner conductor 20 and an outer conductor 22 with suitable insulation between them. Also, as will be apparent, the outer conductor is covered by an insulator 26.

The two ends 20a and 20b of the inner conductor are connected together to the spark discharge device 14. One end 22a of the outer conductor is connected to ground and thus to the other terminal of the discharge device 14. The other end, 22b, of the outer conductor is the output terminal of the generator and it is connected, therefore, to a suitable load 30. The connecting parts have exaggerated lengths in the drawing; they are preferably much shorter than the line 18.

The capacitance between the inner and outer conductors of the line 18 is thus connected in parallel with the discharge device 14. This capacitance is charged from the source 10 through the resistor 12 until the voltage across the capacitance reaches a value, $-V_0$, the ignition point of the discharge device 14. At that point the discharge device ignites, effectively connecting both ends of the inner conductor 20 to ground.

Figure 2:
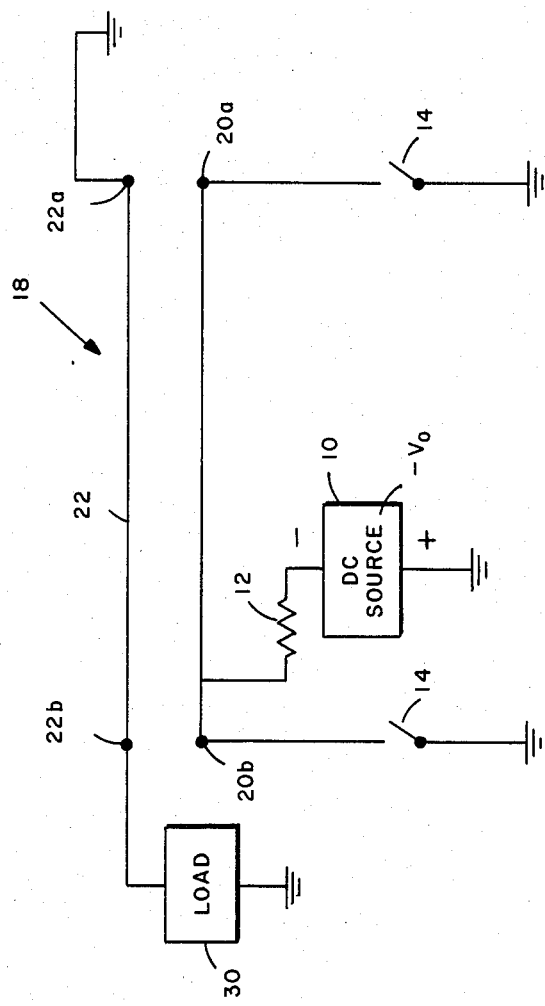
FIG. 2 is a fully schematic diagram to assist in understanding the operation of the invention.

The resulting operation of the circuit will best be understood by referring to the schematic diagram in FIG. 2. The transmission line is depicted as an unfolded line with the discharge device 14 shown as a pair of switches connected at opposite ends of the line to conform with its connection to both ends in FIG. 1.

With reference to FIG. 2, the closing of the lefthand switch 14 connects the load 30 across the transmission line. Also, with the terminal 20b now grounded, its voltage rises by a value of $V_0$ with respect to ground. The voltage at the terminal 22b also rises. However, assuming that the resistance of the load 30 equals the characteristic impedance of the transmission line 18, the voltage at the terminal 22b rises by a factor of $V_0/2$ and thus immediately attains a value of $V_0/2$. At the same time, energy flows along the transmission line 18 toward the load 30 so as to maintain this output voltage. This corresponds to a voltage wave front having a magnitude of $+V_0/2$, moving rightward along the line.

At the same time, the closing of the righthand switch 14 provides a short circuit at the other end of the transmission line. The terminal 22a, which previously had a voltage of $+V_0$ with respect to the terminal 20a now has the same voltage as the latter terminal and thus has undergone a voltage change of $-V_0$ with respect to the terminal 20a. This change propagates leftward along the line as a voltage wave front having a value of $-V_0$. When this wave front reaches the lefthand end of the transmission line 18, the voltage applied to the load 30 decreases by a corresponding amount and thus attains a value of $-V_0/2$.

At the same time that the leftward travelling wave front reaches the load 30, the wave front propogating to the right along the line 18 reaches the end 22a, 20a and because of the short circuit at that end, it is reflected with a reversal of polarity. This results in a wave front of $+V_0/2$ travelling to the left along the waveguide. When this wave front reaches the end 20b, 22b the voltage applied to the load 30 is increased by $V_0/2$, resulting in a zero voltage across the load. Since the load is matched to the characteristic impedance of the transmission line 18, wave fronts travelling to the left on the line are not reflected and, accordingly, at this time the capacitance of the line has been fully discharged into the load. The source 10 then quickly recharges the line capacitance through the resistor 12 and when the voltage at the conductor 20 reaches the breakdown level of the discharge device 14, the capacitance is discharged into the load once again in the manner described above.

From the foregoing it will be apparent that each discharge of the line capacitance results in the application of first a positive and then a negative pulse to the load 30. The duration of each of these pulses is the length of time required for a wave to propagate from one end of the transmission line to the other and this in turn is equal to the product of the wave velocity along the line and the length of the line.

The above-described operation provides sharply defined output pulses, this characteristic being enhanced by the folding of the transmission line so that both ends are connected to the same discharge device and thus are simultaneously grounded.

The generator thus is capable of a rapid succession of high-power pulses and in fact is an efficient generator of high-power RF energy even at very high and ultra-high frequencies. Moreover, it has the reliability of a spark discharge device and as can be seen is inexpensive and light in weight.

What is claimed as new and desired to be secured by Letters Patent of the United States is:

1. A pulse generator comprising:
   A. a transmission line having first and second conductors, each of which has first and second ends,
   B. a spark discharge device having first and second terminals, the first terminal of said discharge device being connected to said first end of said second transmission line conductor and said second terminal of said discharge device being connected to said first and second ends of said first transmission line conductor,
   C. a voltage source connected to apply a charging voltage to said first and second conductors to charge the capacitance between said conductors, whereby said capacitance repetitively charges to the ignition point of said discharge device and said discharge device then discharges to provide an output pulse at said second end of said second transmission line conductor.

2. The pulse generator defined in claim 1 in which said transmission line is looped so that said first and second ends of said first conductor are in close proximity to each other relative to the length of said transmission line.

3. The pulse generator defined in claim 2 in which said transmission line is a coaxial transmission line.

4. The pulse generator defined in claim 1 including an electrical load connected between said first and second ends of said second transmission line conductor.

* * * * *

UNITED STATES PATENT OFFICE
CERTIFICATE OF CORRECTION

PATENT NO. : 4,536,723
DATED : August 20, 1985
INVENTOR(S) : Stephen C. Lang and Paul E. Gili It is certified that error appears in the above-identified patent and that said Letters Patent are hereby corrected as shown below:

Column 2, Line 64 $V_o/2$ should be "$+V_o/2$"

Signed and Sealed this

Seventeenth Day of December 1985

[SEAL]

Attest:

DONALD J. QUIGG

Attesting Officer

Commissioner of Patents and Trademarks